United States Patent
Lindner et al.

(10) Patent No.: US 9,306,182 B2
(45) Date of Patent: Apr. 5, 2016

(54) ORGANIC ZENER DIODE, ELECTRONIC CIRCUIT, AND METHOD FOR OPERATING AN ORGANIC ZENER DIODE

(71) Applicant: Novaled AG, Dresden (DE)

(72) Inventors: Frank Lindner, Dresden (DE); Bjoern Luessem, Dresden (DE); Kentaro Harada, Tokyo (JP); Karl Leo, Dresden (DE)

(73) Assignee: NOVALED AG, Dresden (DE)

( * ) Notice: Subject to any disclaimer, the term of this patent is extended or adjusted under 35 U.S.C. 154(b) by 0 days.

(21) Appl. No.: 14/446,777

(22) Filed: Jul. 30, 2014

(65) Prior Publication Data

US 2014/0340128 A1 Nov. 20, 2014

Related U.S. Application Data

(62) Division of application No. 13/257,459, filed as application No. PCT/DE2010/000332 on Mar. 19, 2010, now abandoned.

(30) Foreign Application Priority Data

Mar. 20, 2009 (DE) .......................... 10 2009 013 685

(51) Int. Cl.
*H01L 35/24* (2006.01)
*H01L 51/05* (2006.01)
(Continued)

(52) U.S. Cl.
CPC .......... *H01L 51/0583* (2013.01); *H01L 29/866* (2013.01); *H01L 51/002* (2013.01);
(Continued)

(58) Field of Classification Search
CPC .......................... H01L 51/0583; H01L 29/866

USPC ............................................ 257/40, E51.001
See application file for complete search history.

(56) References Cited

U.S. PATENT DOCUMENTS 6,908,783 B1    6/2005    Kuehl et al.
6,943,370 B2    9/2005    VanBuskirk et al.
(Continued)

FOREIGN PATENT DOCUMENTS

DE        10209789 A1    9/2003

OTHER PUBLICATIONS

English Translation of Taiwanese Office Action for Taiwanese Application No. 099107233 dated Dec. 16, 2014 (7 pages).
(Continued)

*Primary Examiner* — Anthony Ho
(74) *Attorney, Agent, or Firm* — Sutherland Asbill & Brennan LLP

(57) ABSTRACT

This disclosure relates to an organic zener diode having one electrode and one counter electrode, and an organic layer arrangement formed between the electrode and the counter electrode, wherein the organic layer arrangement includes the following organic layers: an electrically n-doped charge carrier injection layer on the electrode side, made from a mixture of an organic matrix material and an n-dopant, an electrically p-doped charge carrier injection layer on the counter electrode side, made from a mixture of another organic matrix material and a p-dopant, and an electrically undoped organic intermediate layer that is arranged between the electrically n-doped charge carrier injection layer on the electrode side and the electrically p-doped charge carrier injection layer on the counter electrode side. An electronic circuit arrangement with an organic zener diode and method for operating an organic zener diode are also provided.

13 Claims, 6 Drawing Sheets

(51) Int. Cl.
*H01L 29/866* (2006.01)
*H01L 51/00* (2006.01)
*H01L 51/42* (2006.01)

(52) U.S. Cl.
CPC ......... *H01L51/0072* (2013.01); *H01L 51/0081* (2013.01); *H01L 51/4293* (2013.01); *H01L 2251/308* (2013.01)

(56) References Cited

U.S. PATENT DOCUMENTS

| | | |
|---|---|---|
| 7,579,631 B2 | 8/2009 | Gaun et al. |
| 7,858,967 B2 | 12/2010 | Pfeiffer et al. |
| 7,981,324 B2 | 7/2011 | Hartmann et al. |
| 2004/0051096 A1 | 3/2004 | Kingsborough et al. |
| 2005/0061231 A1 | 3/2005 | Stone-Sundberg et al. |
| 2005/0072971 A1 | 4/2005 | Marrocco, III et al. |
| 2005/0139810 A1 | 6/2005 | Kuehl et al. |
| 2006/0098362 A1 | 5/2006 | Fix et al. |
| 2006/0214183 A1 | 9/2006 | Gaun et al. |
| 2006/0250076 A1 | 11/2006 | Hofmann et al. |
| 2007/0252140 A1 | 11/2007 | Limmert et al. |
| 2007/0278479 A1 | 12/2007 | Werner et al. |
| 2008/0203406 A1 | 8/2008 | He et al. |
| 2009/0081824 A1 | 3/2009 | Tripsas et al. |
| 2009/0179189 A1 | 7/2009 | Werner et al. |
| 2009/0212280 A1 | 8/2009 | Werner et al. |
| 2011/0108772 A1 | 5/2011 | Zeika et al. |

OTHER PUBLICATIONS

Lampert et al., 1970, "Current Injection in Solids," Academic, New York, pp. 44-47 and 105-106.
Harada et al., 2004, "Realization of Organic pn-homojunction Using a Novel n-type Doping Technique," Proceedings of the Spie, vol. 5464:1-9.
Yamashita et al., 1995, "Fabrication of an Organic p-n. Homojunction Diode Using Electrochemically Cation- and Photochemically Anion-Doped Polymer," Japanese Journal of Applied Physics, vol. 34(7B):3794-3797.
PCT International Search Report for PCT/DE2010/000332 mailed Jun. 10, 2010 (3 pages).
PCT International Preliminary Report on Patentability for PCT Application No. PCT/DE2010/000332 mailed Oct. 20, 2011.
Translation of Japanese Office Action for Japanese Application No. 2012-500067 mailed Jun. 17, 2014 (2 pages).
Harada et al., 2008, "Pentacene Homojunctions: Electron and Hole Transport Properties and Related Photovoltaic Responses," Physical Review B, 77:195212.

ORGANIC ZENER DIODE, ELECTRONIC CIRCUIT, AND METHOD FOR OPERATING AN ORGANIC ZENER DIODE

CROSS-REFERENCE TO RELATED APPLICATIONS

This application is a division of U.S. patent application Ser. No. 13/257,459, filed Dec. 2, 2011, which claims priority to PCT Application No. PCT/DE2010/000332, filed Mar. 19, 2010, which claims priority to German Patent Application Number 10 2009 013685.1, filed Mar. 20, 2009. The contents of U.S. patent application Ser. No. 13/257,459, PCT Application No. PCT/DE2010/000332, and German Patent Application Number 10 2009 013685.1 are incorporated herein by reference.

FIELD OF THE INVENTION

The invention relates to an organic zener diode, an electronic circuit and a method for operating an organic zener diode.

BACKGROUND OF THE INVENTION

The steady advances in microelectronics are causing structures to shrink continuously, even as more and more components are being place on a given area. This trend is also evident in the development of larger and larger data memories. The classic silicon-based semiconductor technology is nearing its limits for physical and financial reasons, and will soon not be able to keep pace with the drive towards miniaturisation. Components that are being manufactured today have structure sizes of several tens of nanometres. New concepts and materials are needed that will enable the structure sizes and thus entire components to be shrunk yet further, to a few nanometres.

The demand for novel, inexpensive electronics, preferably providing functionalities on flexible substrates continues to grow. For example applications such as intelligent admission cards, extremely inexpensive transponder labels or electronics integrated in clothing are conceivable. Besides their other requirements, all such applications also need memory components. Microelectronics based on crystalline semiconductors can only offer a limited level of functionality for these.

Passive storage concepts have the advantage of a relatively simple construction and the ability to be integrated easily in 3D concepts. Resistive storage concepts, that is to say memories that can assume various electrical resistances and thus store information content, are viewed as promising for purposes of mass storage in the future because of their scalability to the molecular magnitude. A simple construction in crossbar technology enables these components to be produced cheaply and integrated in 3D concepts. One disadvantage of this construction is that it is susceptible to crosstalk with adjacent cells when programming or deleting individual elements. In order to prevent this, and to enable larger memory arrays to be produced, additional active and passive components are necessary. One option consists in connecting each memory cell individually to a zener diode. Thus, crosstalk is prevented by the strongly non-linear characteristic curve. Zener diodes are easy to implement and are used widely in classic silicon technology to stabilise voltages and protect important modules from destruction.

These diodes behave like normal diodes in the forward bias direction, but in the reverse bias direction their resistance suddenly falls dramatically above a certain voltage, the breakdown voltage. The breakdown voltage can be adjusted from 3 to 100V by selectively changing the doping of the electron-conducting layer and/or the hole conducting layer and the modification this brings about in the width of the depletion layer. Zener diodes are currently also used in passive matrix memories. Since these crossbar memories are theoretically scalable down to the molecular level, silicon technology will shortly reach its limits in this field as well.

Accordingly, the search for alternative methods and materials to replace the classic silicon technology is being conducted intensively all over the world.

Organic electronics has emerged as a promising alternative to silicon-based electronics. Among its advantages is the fact that it involves relatively simple processes such as printing or vapour deposition at low temperatures, the ability to work on flexible substrates, and the wide variety of molecular materials.

The filed of organic electronics is having its first applications in organic light emitting diodes (OLEDs).

Following a relatively short development period, these can already be found in many devices. Even now, in the research stage, the efficiencies of these OLEDs are reaching record values that most other light sources cannot rival. The development of OLEDs provides an indication of the potential that is as yet untapped in organic electronics. However, before organic electronics can be treated as a fully developed system, it is necessary to produce not only light emitting diodes but also organic transistors, organic memories and other components in order to take full advantage of the cost benefit in production and to avoid having to rely on a combination of organic electronics and classic silicon technology. Besides organic transistors, organic solar cells are the subject of considerable research efforts all over the world. Although they do not yet offer the same efficiency levels as classic solar cells, they are easy to produce, and as such have the potential for an enormous cost advantage over silicon solar cells. As the number of components increases, components that protect the primary electronics from external influences are needed in organic electronics as well. Voltage stabilisation and overvoltage protection are important considerations, among others.

A number of organic thin film zener diodes consisting of one or more organic layers are known. Several different approaches for such diodes are described in US 2004/0051096 A1. Up to three organic layers of various materials are applied between two electrodes. The zener voltage can be adjusted through appropriate selection of the organic material, electron-conducting (n-conducting) or hole-conducting (p-conducting) for example. The zener voltage can be changed by altering the sequence of layers of organic materials. This document will also show that different zener voltages also result from different electrodes. With the appropriate selection of material, it is possible to achieve zener voltages in the range from 0.1V to 7V. If a specific zener voltage is required, it is possible with a suitable combination of organic material, electrodes, and layer structure. At the same time, however, the current-voltage curve is also altered in the forward direction, which represents a significant drawback. In the forward direction, it is desirable for the diode behaviour to remain as consistent as possible for different zener voltages. Another disadvantage is that only certain electrode materials and combinations can be used for a given zener voltage. This places marked limitations on design freedom.

Another problem with this design is the poor electrical contact properties between the electrodes and the organic material. Injection of charge carriers is hindered by large barriers for electrons as well as holes at the respective boundary surfaces between the organic layers and the metal contacts.

Finally, electrical conductivity in undoped layers is highly sensitive to the layer thickness (a cubic dependency is expected under the precondition of ohmic injection: M. A. Lampert et. al, Current injection in solids, Academic, New York, 1970). As a result, the approaches in production described in US 2004/0051096 A1 are vulnerable to inconsistencies in the production process.

The object of the invention is to provide an improved zener diode, of simple construction and offering improved performance in conjunction with the breakdown voltage. The zener diode should demonstrate stable, reproducible behaviour, and it should be possible to adjust the breakdown voltage without altering the forward bias characteristic curve.

SUMMARY OF THE INVENTION

This object is solved with an organic zener diode having one electrode and one counter electrode, and an organic layer arrangement formed in electrical contact therewith, wherein the organic layer arrangement comprises the following organic layers: an n-doped charge carrier injection layer on the electrode side, made from a mixture of an organic matrix material and an n-dopant; a p-doped charge carrier injection layer on the counter electrode side, made from a mixture of another organic matrix material, which may optionally be the same as or different from the matrix material on the electrically n-doped charge carrier injection layer on the electrode side, and a p-dopant, an electrically undoped organic intermediate layer that is arranged between the n-doped charge carrier injection layer on the electrode side and the p-doped charge carrier injection layer on the counter electrode side. In addition, electronic circuits as described herein, including an electronic circuit arrangement having an organic zener diode and a storage element combined therewith, and methods for operating an organic zener diode are also provided, wherein the organic zener diode is in an electronic circuit, and wherein a protective state is created for components that are connected in sequence with the organic zener diode in the electronic circuit by limiting to the value of the breakdown voltage an electrical voltage that is applied to the electrode and the counter electrode and draining the current flow created by the applied voltage via the organic zener diode. Advantageous configurations of the invention are the object of dependent claims.

BRIEF DESCRIPTION OF THE DRAWINGS

In the following, the invention will be explained in greater detail using exemplary embodiments and with reference to the figures of a drawing. In the drawing.

DETAILED DESCRIPTION OF THE INVENTION

Figure 1:
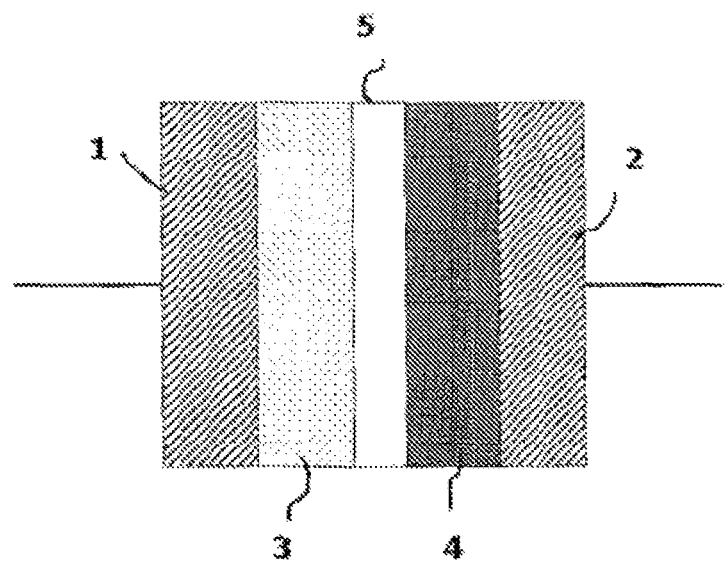
FIG. 1 is a schematic representation of a layer sequence for an organic zener diode.

The reverse bias breakdown voltage of the organic zener diode is adjustable simply by altering the thickness of the intermediate layer. Alternatively or in addition thereto, the reverse bias breakdown voltage may also be adjusted by changing the doping concentration of the hole conducting charge carrier transport layer and/or the doping concentration of the electron conducting charge carrier transport layer. In this case, adjusting the reverse bias breakdown voltage has no effect on the forward bias behaviour of the diode. This results in an advantageous capability to manufacture organic zener diodes having different breakdown voltages simply and reproducibly.

Advantages over the prior art also consist particularly in the fact that a semiconductor component of such kind may be manufactured inexpensively using standard manufacturing methods. Whereas the forward bias characteristic curve is difficult to control in organic zener diodes that consist of only one organic layer and two electrodes, with the invention the breakdown behaviour is controllable, stable, and reproducible in both the forward and reverse bias directions.

The charge carrier injection layer and the intermediate layer may include inorganic materials.

A preferred refinement of the invention provides that the n-dopant and/or the p-dopant is a molecular dopant. Because of the relatively high current densities in the working range of organic zener diodes, diffusion of the doping ions or doping molecules is to be expected. Because of their size, the likelihood that molecular dopants will be diffused is many times smaller than the likelihood that ions will be diffused. Accordingly, it is possible to operate the component at significantly higher current densities and thus also at higher temperatures.

Doping with organic materials enables the use of "high gap" materials. The use of these materials with a large energy gap enables the manufacture of transparent components. The great advantage of these is that visible light is neither absorbed nor emitted. Consequently, these components may be used in direct combination with OLED displays, for example.

Organic dopants as such are described for example in EP 1 988 587. The dopants described in examples 1 to 9 in that document are preferred for the use under consideration. Other preferred p-dopants are described in US 2005/0139810. Preferred n-dopants are also disclosed in the documents US 2005/0061231, WO 2005/086251 as well as EP 1 837 926 and EP 1 837 927. Preferred hole transport materials (HTM semiconductors that are dopable by a p-dopant and transport holes) are described for example in the document EP 1 988 587. Preferred electron transport materials (ETM semiconductors that are dopable by an n-dopant and transport electrons) include for example BPhen, BCP or other phenanthroline derivatives, Alq3, C60, PTCBI, PTCDI, TCNQ, PBD, OXD, TAZ, TPOB, BAlq.

In one practical configuration of the invention, it may be provided that the electrically undoped organic intermediate layer has unipolar charge carrier transporting properties, so that the mobility for charge carriers in the form of electrons differs from the mobility for charge carriers in the form of holes. It is preferred if $|\mu h/\mu e|$ or $|\mu e/\mu h|$ is greater than 10, more preferably it is greater than 1000.

According to an advantageous embodiment of the invention, the electrically undoped organic intermediate layer has ambipolar charge carrier transporting properties, so that the mobility for charge carriers in the form of electrons and the mobility for charge carriers in the form of holes are essentially the same. In order to enable a steep rise in the forward bias characteristic curve and still keep voltages low, the intermediate layer should preferably consist of an ambipolar material. This ensures that both electrons and holes are involved in transporting the charge in the forward direction, which in turn means that relatively high currents are achieved even with low voltages.

A refinement the invention provides that the electrically undoped organic intermediate layer preferably contains or consists of exactly one organic material.

In an advantageous configuration of the invention, it may be provided that the electrically undoped organic intermediate layer contains or consists of a mixture of several organic materials.

A development of the invention may provide that the electrode-side electrically n-doped charge carrier injection layer contains the organic matrix material and the organic n-dopant in a ratio of at least 1 mol % dopant to matrix material, and the electrically p-doped charge carrier injection layer on the counter electrode side contains the organic matrix material and the organic p-dopant in a ratio of at least 1 mol % dopant to matrix material. In another preferred configuration, the ratio is at least 2 mol %. It is further preferred if the doping concentration of the doped layers is at least 4 mol %.

A preferred refinement of the invention provides that the charge carrier injection layers on the electrode and the counter electrode sides are each electrically doped with metal ions.

According to a practical configuration of the invention, it may be provided that the organic matrix material and the additional organic matrix material are the same, and that the electrically undoped organic intermediate layer contains the same organic matrix material. In one configuration, the material for the injection layers is used as the matrix material, and is n-doped or p-doped respectively. In the intermediate layer, this material is used undoped in its intrinsic form. A combination of this kind is referred to as "homojunction".

An advantageous embodiment of the invention provides that an electrically undoped organic intermediate layer having a layer thickness between about 1 Angstrom and about 100 nm, preferably between about 1 nm and about 10 nm, is formed.

A refinement of the invention preferably provides that at least one of the following layers contains at least one inorganic material: the electrically n-doped charge carrier injection layer on the electrode side, the electrically p-doped charge carrier injection layer on the counter electrode side, and the electrically undoped organic intermediate layer.

In an advantageous configuration of the invention, it may be provided that at least one of the organic layers, that is to say the electrically n-doped charge carrier injection layer on the electrode side, the electrically p-doped charge carrier injection layer on the counter electrode side, and the electrically undoped organic intermediate layer, contains at least one organic material selected from the following group of organic materials: oligomer material and polymer material.

A small energy barrier is preferably smaller than 0.5 eV, more preferably 0 eV. The energy barrier is considered to be barrier to the charge carrier injection of the charge carrier injection layer into the intermediate layer when the component is used in normal diode operation. The low barrier is preferred in order to obtain the lowest possible threshold voltages and the steepest possible characteristic curves.

In this context, the layers that are arranged between the two electrodes are referred to as active layers. They may comprise organic materials; in particular, the technical term used for these molecules in the field of organic semiconductors is "small molecules". The active layers may also comprise oligomers. The active layers may also comprise polymers.

The layers, specifically the electrodes, the injection layers, the semiconductor layers and/or the intermediate layers, are preferably produced via one of the following methods:

Vacuum evaporation: This is the usual method for producing very thin layers. The organic layers are evaporated mainly by thermal evaporation or PVD ("Physical Vapour Deposition"). The inorganic layers can be separated by thermal evaporation, sputtering, laser ablation, spray pirolisys, CVD ("Chemical Vapour Deposition") and other methods. These methods do not necessarily have to take place in a vacuum, they may also be carried out in a shielding gas atmosphere.

Wet chemical procedures or deposition from solution: This includes methods such as "spincoating", "blade-gap coating", "stamping", printing (ink-jet) or similar.

"Organic vapour phase deposition": The production of mixed layers by this method is explained in EP 1 780 816 A1 (see paragraphs [0011] to [0013]). The production of doped layers by this method is described in EP 1 780 816 A1 (see paragraphs [0017] to [0019]).

The deposition of the layers is always carried out onto a substrate or onto previous layers that have already formed on the substrate. Optionally, the substrate may also serve another function besides just its carrier function. For example, the substrate may be conductive and may also form the electrode of the diode.

Other preferred aspects of the invention will be explained in the following.

Operation of an organic diode in reverse bias with current breakdown may be provided so that current essentially flows through the diode, wherein the diode comprises the following layers between two conductive electrical contacts: an electrically n-doped organic semiconductor layer, and electrically undoped organic semiconductor layer, and an electrically p-doped organic semiconductor layer.

Operation of an organic diode in reverse bias with current breakdown may also be provided so that current essentially flows through the diode, wherein the diode has layers between two conductive electrical contacts (electrodes) in the following order: an electrically n-doped organic semiconductor layer, and electrically undoped organic semiconductor layer, and an electrically p-doped organic semiconductor layer.

Further, a method may be provided for operating an organic semiconductor element, particularly an organic zener diode, having one electrode and one counter electrode as well as an organic layer arrangement formed between the electrode and the counter electrode and in electrical contact therewith, wherein the organic layer arrangement comprises the following organic layers: a charge carrier injection layer on the electrode side, a charge carrier injection layer on the counter electrode side, and an intermediate layer area arranged between the two, wherein a protective state for subsequent components is achieved during the process by applying an electrical voltage greater than the breakdown voltage so that the electrical voltage is limited to the breakdown voltage value and draining the current flow created by the applied voltage via the organic zener diode.

The organic zener diode is preferably used in combination with a storage element.

The invention further encompasses the idea of an organic electronic semiconductor element with an electrode and a counter electrode, and an organic layer arrangement formed between the electrode and the counter electrode and in electrical contact therewith. The organic layer arrangement comprises the following organic layers: a charge carrier injection layer on the electrode side and a large carrier injection layer on the counter electrode side as well as a layer area with an intermediate layer located between the two.

The electrode and the counter electrode are preferably made from a highly conductive material, for example a metal. Non-metallic electrode materials may also be used provided they have a certain electrical conductivity. Non-metallic electrode materials of such kind include for example highly conductive oxides, SnO, In:SnO (ITO), F:SnO, ZnO, heavily doped inorganic and organic semiconductors such as a-Si, c-Si or similar, nitrides and polymers.

Another configuration provides that the intermediate layer consists of a hybrid layer of two different organic materials, one material being particularly suitable for conducting electrons and the other material being particularly suitable for conducting holes.

The requirement for a high current with relatively low voltages in the forward bias direction may also be satisfied by an intermediate layer consisting of a material that has a very small "energy gap" ("low gap"). In this case, the electrons and holes do not have to overcome any energy barriers that would prevent the charge from being transported. Larger currents are achieved with lower voltages.

The charge carrier transport layers on the electrode and counter electrode sides serve to effectively inject charge carriers in the form of electrons or holes (defect electrons) into the organic layer arrangement and there to transport them without significant electrical losses.

Doping of organic materials is known in various forms. n-doping or p-doping of the organic material may be provided. The n-dopant is usually selected from molecules or neutral radicals for which the HOMO level (HOMO—"Highest Occupied Molecular Orbital") is lower than 4.5 eV, preferably lower than about 2.8 eV, and more preferably lower than about 2.6 eV. The HOMO level of the doping material can be determined from cyclovoltammetric measurements of the oxidation potential. Alternatively, the reduction potential of the donor cation may be determined in a salt of the donor. The donor should have an oxidation potential with reference to Fc/Fc+ (ferrocene/ferrocenium redox couple) less than or equal to about −1.5V, preferably less than or equal to about −2.0V and more preferably less than or equal to about −2.2V. The molar mass of the n-doping material is preferably between about 100 and about 2000 g/mol, and more preferably between about 200 and 1000 g/mol. In a preferred embodiment, a molar doping concentration for electric n-doping is between 1:1000 (acceptor molecule: matrix molecule) and 1:2, preferably between 1:100 and 1:5, and more preferably between 1:100 and 1:10.

It may be provided that the donor is only formed from a precursor as the organic layers are being manufactured or while the subsequent layer manufacturing process is in progress, as is described as such in DE 103 07 125. The values for the HOMO level of the donor cited previously then refer to the species that is created thereby. Alternatively, the doping of the organic material may also be carried out by a different method. Such different methods include for example co-evaporation of the organic material with a metal that has a low work function. Lithium and caesium are examples of substances that as suitable for n-doping.

The p-dopant is usually selected from molecules or neutral radicals for which the LUMO level (LUMO—"Lowest Unoccupied Molecular Orbital") is energetically below 4.5 eV, preferably below 4.8 eV, and more preferably below 5.04 eV. The LUMO level of the acceptor for p-doping can be determined with the aid of cyclovoltammetric measurements of the reduction potential. The acceptor preferably has a reduction potential with reference to Fc/Fc+ of at least −0.3V, more preferably at least −0.0V and most preferably at least 0.24V. Acceptors having a molar mass of about 100 to 2000 g/mol, preferably a molar mass between about 200 and 1000 g/mol, and more preferably a molar mass between about 300 g/mol and 2000 g/mol are preferred. In a practical embodiment, the molar doping concentration for p-doping is between 1:1000 (acceptor molecule: matrix molecule) and 1:2, preferably between 1:100 and 1:5, and more preferably between 1:100 and 1:10. The acceptor does not have to be formed from a precursor until the layers are being manufactured or while the subsequent layer manufacturing process is in progress. The LUMO level of the acceptor indicated above then refers to the species created thereby.

Examples of such materials are given in documents DE 103 478 56 B8, EP 1 837 926 B1 or also U.S. Pat. No. 6,908,783 B1. Metals such as caesium or lithium and others are also used in n-doping. In addition, oxides such as vanadium pentoxide (V2O2) or even molybdenum oxide (Mo2O3) may also be used as p-dopants.

One embodiment provides for the zener diode to be used in an electronic circuit to generate a voltage reference.

Another embodiment provides for the zener diode to be used in combination with other organic or inorganic components.

FIG. 1 is a schematic representation of a layer sequence for an organic electronic zener diode. A charge carrier injection layer 3 on the electrode side, a charge carrier injection layer 4 on the counter electrode side, and an intermediate layer 5 arranged between the two are disposed between an electrode 1 and a counter electrode 2.

Figure 2:
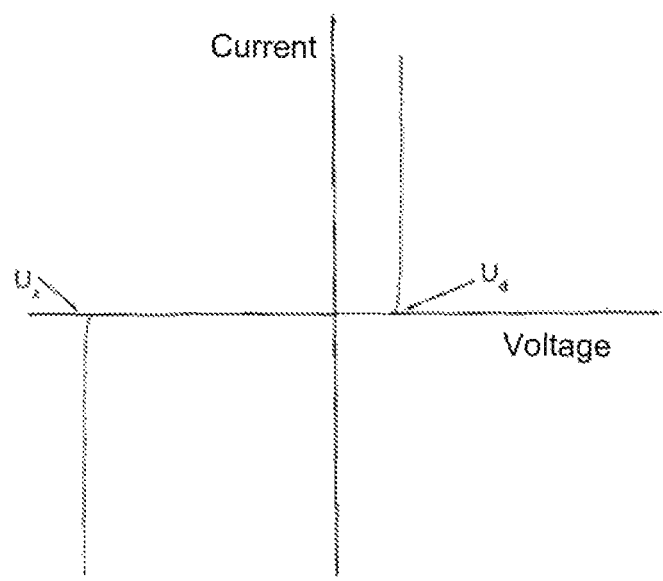
FIG. 2 is a current-voltage curve of an ideal zener diode.

FIG. 2 is a schematic representation of a current-voltage characteristic curve of an ideal zener diode with the characterizing voltages Ud as the forward bias voltage and Uz as the breakdown voltage.

Figure 3:
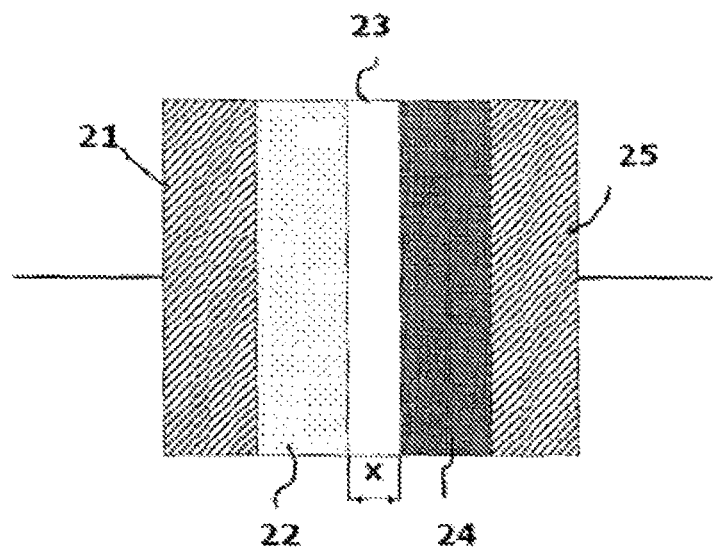
FIG. 3 is a schematic representation of a layer sequence for an organic zener diode according to FIG. 2 with modifiable transport layer.

FIG. 3 is a schematic representation of a layer sequence for an organic electronic zener diode.

A charge carrier injection layer 22 on the electrode side, a charge carrier injection layer 24 on the counter electrode side, and a transport layer 23 arranged between the two are disposed between an electrode 21 and a counter electrode 25. The thickness (x) of the intermediate layer in this case is variable.

In order for the component to function reliably, it is beneficial to use highly pure forms of all organic materials, as may be achieved for example by gradient sublimation in a vacuum. This avoids leakage currents, which can occur as a result of "trap states". Organic materials that have been purified by sublimation are helpful for correct, reproducible breakdown behaviour.

EXAMPLES

Example 1

As a first embodiment, the following structure was selected:
- (21.1) Anode: Indium tin oxide (ITO)
- (22.1) Injection layer for holes: 50 nm 2,2',7,7'-Tetrakis(N,N-di-p-methylphenylamino)-9,9'-spirobifluorene doped with 4% by weight 2,2'-(Perfluoronaphthaline-2,6-diylidene)-dimalodinitrile
- (23.1) Hybrid intermediate layer: 5 nm TCTA:TPBi
- (24.1) Injection layer for electrons: 50 nm BPhen doped with caesium
- (25.1) Cathode: 100 nm aluminium All layers are produced in a vapour deposition process in a vacuum. In principle, such layers may also be produced by other methods, such as spin coating, blade gap coating, organic vapour phase deposition, or self-assembly. The intermediate layer is formed by a hybrid layer of an n-conductive and a p-conductive organic material. The mixing ratio in the embodiment is 1:1.

Figure 4:
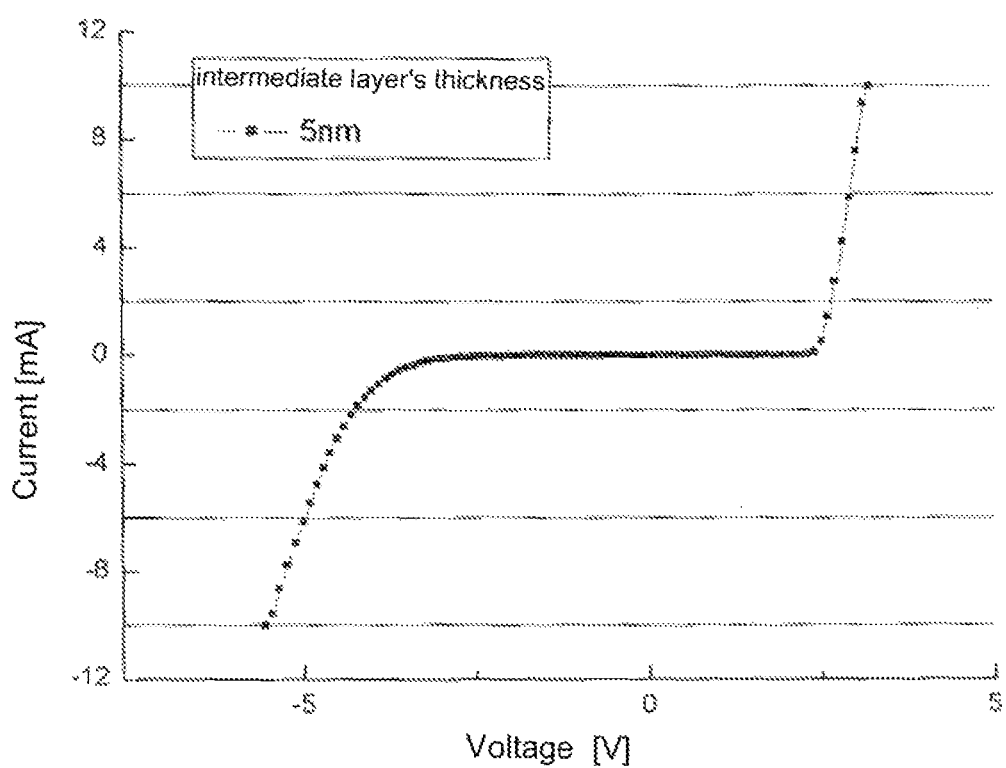
FIG. 4 is a current-voltage curve for a first embodiment with a 5 nm thick intermediate layer of TCTA:TPBI in a ratio of 1:1.

FIG. 4 shows a current-voltage curve for an organic component as shown in FIG. 3. Thickness x of the transport layer is 5 nm. It produces typical diode behaviour when a positive voltage is applied to the anode (forward bias). When a negative voltage is applied to the anode (reverse bias), the current increases sharply after a voltage Uz. The breakdown voltage is usually measured with a reference current of approximately 1 to 5% of the maximum permitted reverse current.

An important parameter for zener diodes is their differential resistance in the breakdown range. The smaller this resistance is, the steeper is the characteristic curve in the zener diode's breakdown range. One consequence of this is better voltage stabilisation. This differential resistance in the reverse bias direction may be lowered with a higher molecular ratio between the dopant and the matrix. If higher doping is selected, more free charge carriers are available for transporting the current. This increases conductivity. This is particularly noticeable in the reverse direction, since in the forward direction above a certain doping the current is not limited by conductivity any more but by the barriers at the boundary surfaces. The components shown, and particularly the doping ratio of the injection layers, may thus be further optimised and adapted to respective requirements.

In order to further improve the behaviour of the components in the reverse direction, the surface area of the components may be reduced, for example. The purpose of this is to reduce the capacitive effects. Another option for lowering the differential resistance and thus also improve the properties is to replace the ITO with gold, for example, as the anode material. ITO has a relatively high lateral resistance, which is also included in its differential resistance, since the cross resistance is applied to the layers that are actually active in series. If this resistance is reduced, the differential resistance of the component as a whole is lowered.

The hole transport layer 22 on the anode side is made from 2,2',7,7'-Tetrakis(N,N-di-p-methylphenylamino)-9,9'-spirobifluorene. 2,2'-(Perfluoronaphthaline-2,6-diyliden)-dimalodinitrile is used as a molecular dopant. F4-TCNQ may also be used instead of the material used in this embodiment, 2,2',7,7'-Tetrakis(N,N-di-p-methylphenylamino)-9,9'-spirobifluorene and 2,2'-(Perfluoronaphthaline-2,6-diyliden)-dimalodinitrile.

Example 2

Figure 5:
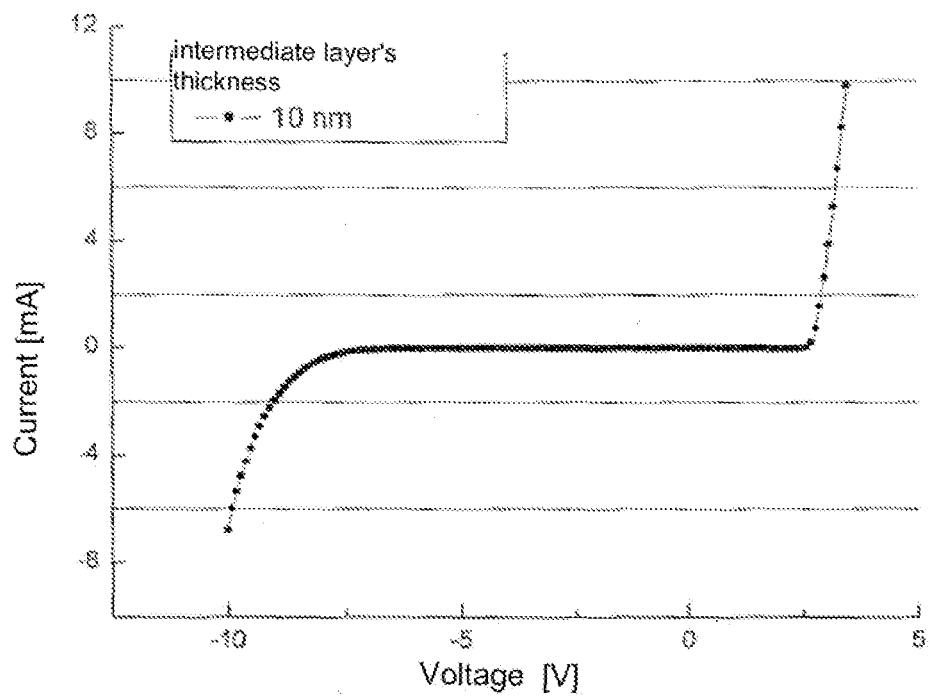
FIG. 5 is a current-voltage curve for a second embodiment with a 10 nm thick intermediate layer of TCTA:TPBI in a ratio of 1:1.

In a second embodiment of an organic zener diode according to FIG. 1, the following structure is provided:
- (21.2) Anode: Indium-tin oxide (ITO)
- (22.2) Injection layer for holes: 50 nm 2,2',7,7'-Tetrakis(N,N-di-p-methylphenylamino)-9,9'-spirobifluorene doped with 4% by weight 2,2'-(Perfluoronaphthaline-2,6-diyliden)-dimalodinitrile
- (23.2) Intermediate hybrid layer: 10 nm TCTA:TPBi
- (24.2) Injection layer for electrons: 50 nm BPhen doped with caesium
- (25.2) Cathode: 100 nm aluminium FIG. 5 shows a current-voltage curve for an organic electronic component according to FIGS. 1 and 3. In this case, thickness x of the transport layer is 10 nm. In the forward bias direction, the embodiment exhibits typical diode behaviour. Unlike the embodiment with a 5 nm intermediate layer, the reverse bias characteristic curve obtained is shifted significantly towards larger negative voltages.

Figure 6:
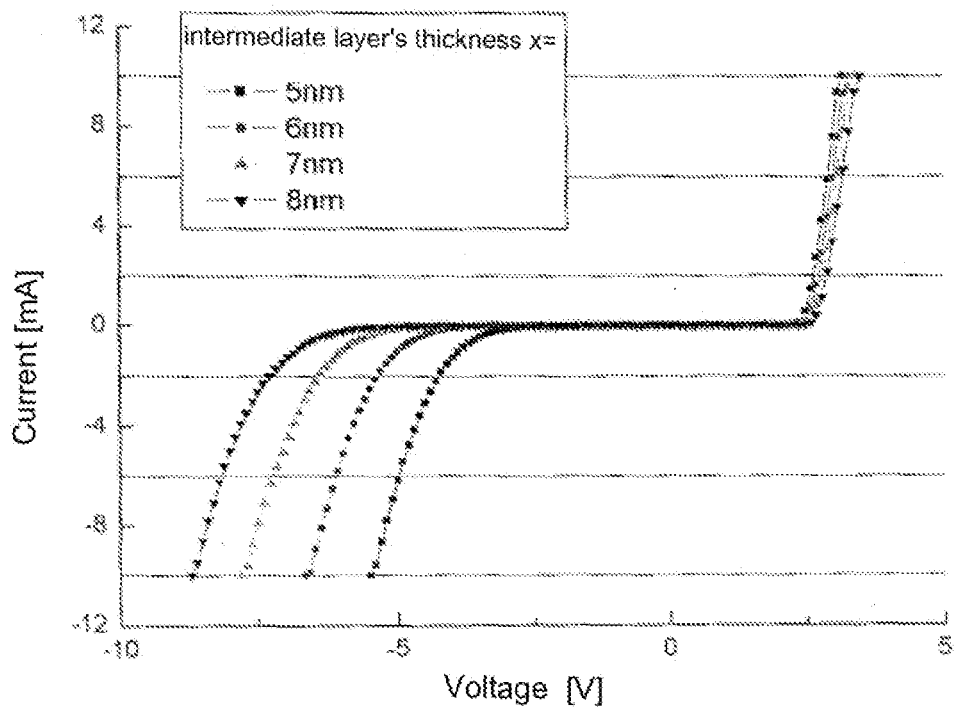
FIG. 6 is a current-voltage curve for organic zener diodes according to FIG. 1 with various intermediate layer thicknesses of TCTA:TPBI in a ratio of 1:1.

FIG. 6 shows several current-voltage curves for organic zener diodes according to FIGS. and 3. Thickness x of the intermediate layer is varied between 5 nm and 8 nm. The breakdown voltage is shifted by 3V.

Example 3

Figure 7:
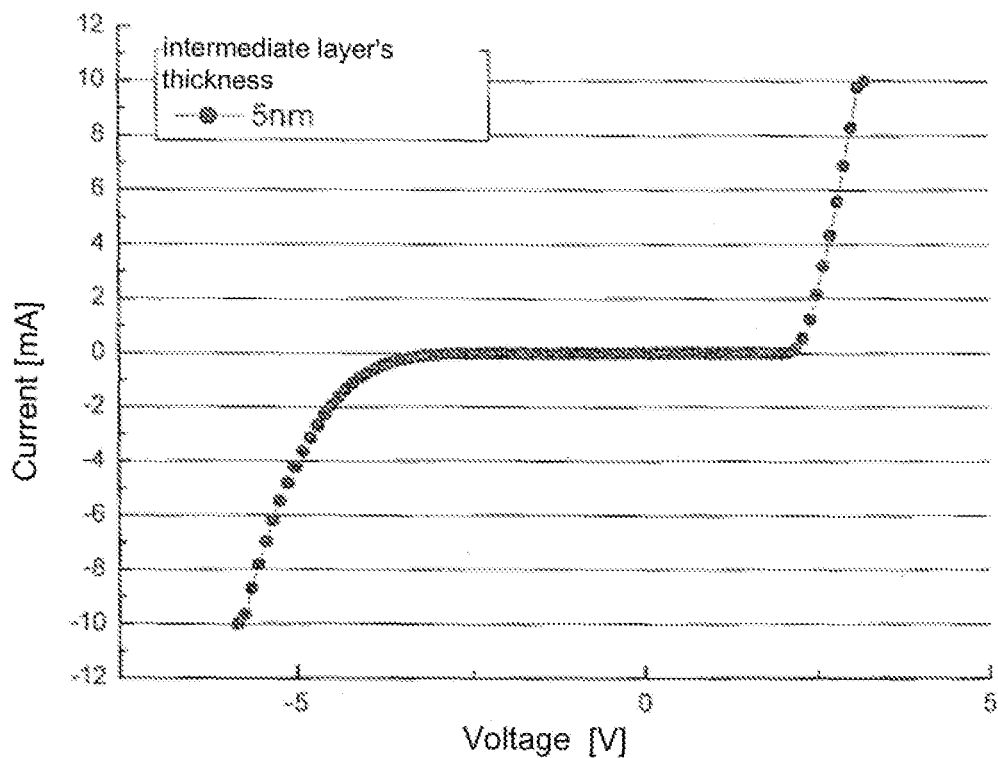
FIG. 7 is a current-voltage curve for organic zener diodes according to FIG. 1 with a 5 nm thick intermediate layer of Balq:NPB in a ratio of 1:1.

In a third embodiment of an organic zener diode according to FIG. 1, the following structure is provided:
- (21.3) Anode: Indium-tin oxide (ITO)
- (22.3) Injection layer for holes: 50 nm Meo-TPD doped with 4% by weight 2,2'-(Perfluoronaphthaline-2,6-diyliden)-dimalodinitrile
- (23.3) Hybrid intermediate layer: 5 nm Balq:NPB
- (24.3) Injection layer for electrons: 50 nm BPhen doped with caesium
- (25.3) Cathode: 100 nm aluminium FIG. 7 shows a current-voltage curve for an organic electronic component according to FIG. 1. In this case, thickness x of the transport layer is 5 nm. In the forward direction, the embodiment exhibits typical diode behaviour. In the reverse direction, an exponential rise in current is observed for a given Uz.

Example 4

Figure 8:
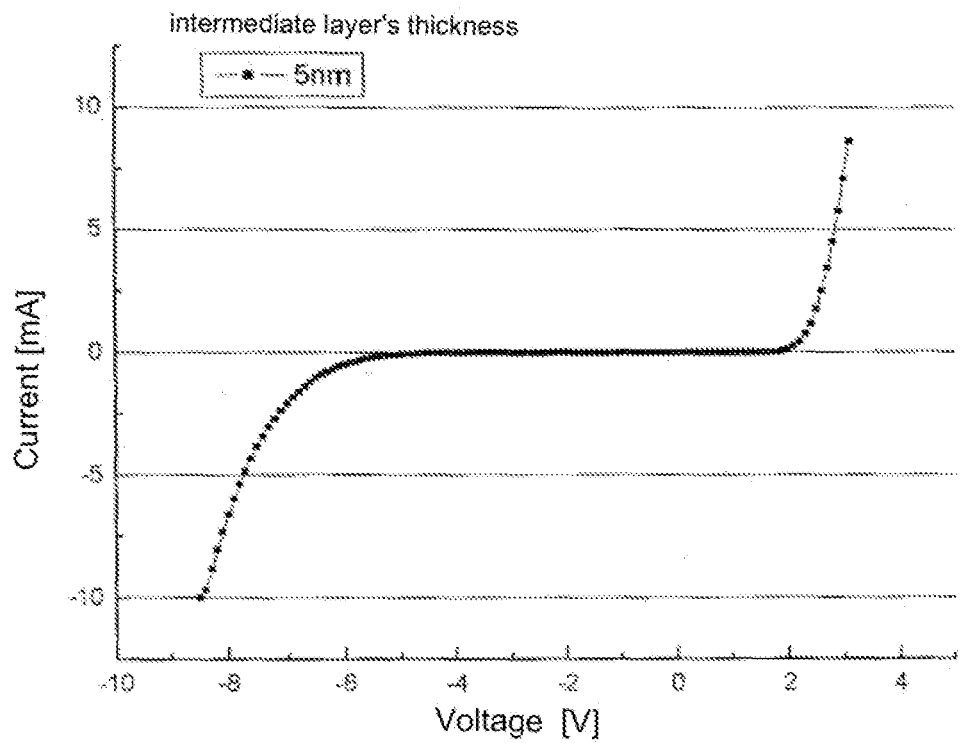
FIG. 8 is a current-voltage curve for organic zener diodes according to FIG. 1 with a 5 nm thick intrinsic intermediate layer of the same material that is used as the matrix for the charge carrier injection layers.

In a fourth embodiment of an organic zener diode according to FIG. 1, the following structure is provided:
- (21.4) Anode: Indium-tin oxide (ITO)
- (22.4) Injection layer for holes: 50 nm RE68 2% by weight 2,2'-(Perfluoronaphthaline-2,6-diylidene)-dimalodinitrile (23.4) Hybrid intermediate layer: 5 nm RE68
(24.4) Injection layer for electrons: 50 nm RE68 2% by weight Tetrakis(1,3,4,6,7,8-hexahydro-2H-pyrimido [1,2-a]pyrimidinato)ditun gsten(II)
(25.4) Cathode: 100 nm aluminium This embodiment relates to an organic zener diode that differs from the previous embodiments in that the cathode-side injection layer is made from an n-doped material, the intermediate layer is made from the same material in intrinsic form, and the anode-side injection layer consists of the same material but with p-doping. FIG. 8 shows a current-voltage characteristic curve for this embodiment. In this example too, the reverse bias characteristic curve may be shifted by varying the intrinsic thickness of the intermediate layer.

Figure 9:
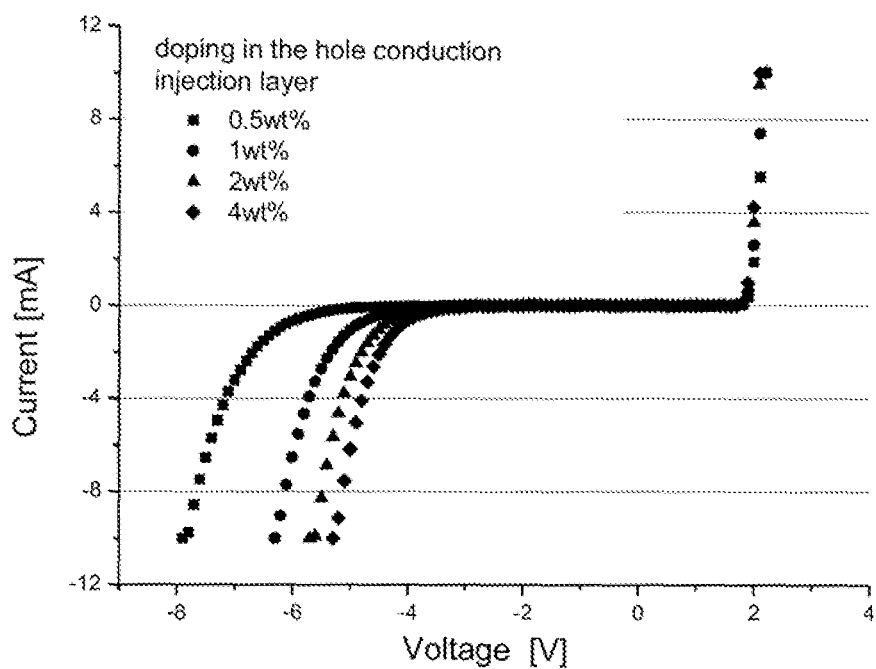
FIG. 9 is a current-voltage curve for organic zener diodes with structure according to FIG. 1 and having a 7 nm thick intrinsic intermediate layer of the same material that is used as the matrix for the charge carrier injection layers, for different doping concentrations of the hole conducting injection layer.

FIG. 9 shows the current-voltage characteristic curve of a component according to the fourth embodiment having an intrinsic layer thickness of 7 nm. The characteristic curves for various doping conditions of the hole conducting injection layer are shown.

Figure 10:
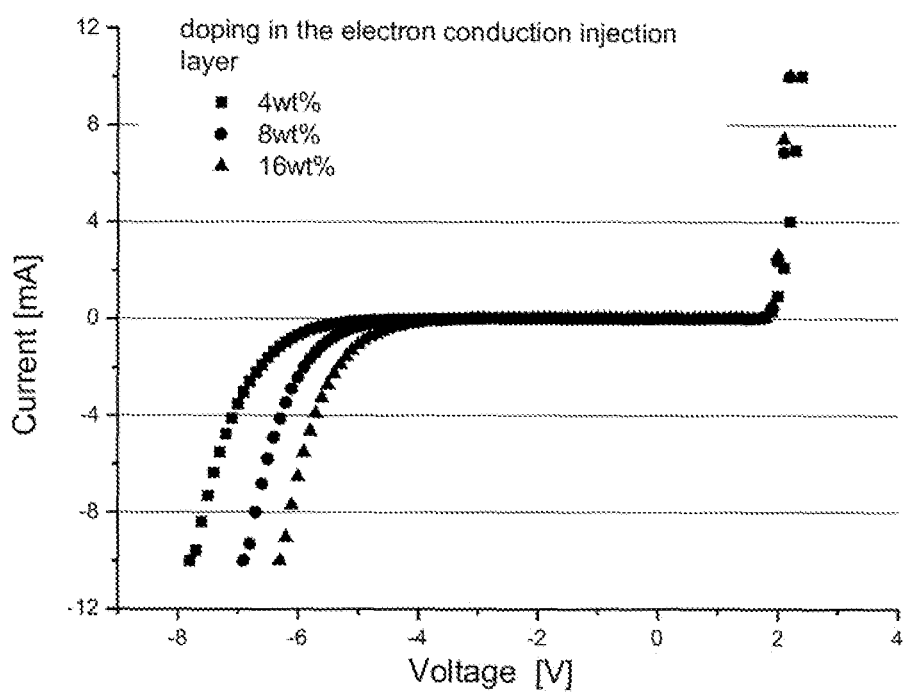
FIG. 10 is a current-voltage curve for organic zener diodes with structure according to FIG. 1 and having a 7 nm thick intrinsic intermediate layer of the same material that is used as the matrix for the charge carrier injection layers, for different doping concentrations of the electron conducting injection layer.

FIG. 10 shows the current-voltage characteristic curve of a component according to the fourth embodiment having an intrinsic layer thickness of 7 nm. The characteristic curves for various doping conditions of the electron conducting injection layer are shown.

Example 5

In a fifth embodiment of an organic zener diode according to FIG. 1, the following structure is provided:
(21.4) Anode: Indium-tin oxide (ITO)
(22.4) Injection layer for holes: 50 nm 4% by weight pentacene, doped with 2,2'-(Perfluoronaphthaline-2,6-diylidene)-dimalodinitrile
(23.4) Hybrid intermediate layer: 30 nm pentacene
(24.4) Injection layer for electrons: 50 nm BPhen doped with caesium
(25.4) Cathode: 100 nm aluminium This embodiment relates to an organic zener diode that differs from the previous embodiments in that the anode-side injection layer is made from a p-doped organic low gap material. The intermediate layer consists of the same material, but is present intrinsically in the intermediate layer. The cathode-side charge carrier injection layer consists of an organic high gap material doped with metal ions. In this embodiment too, the reverse bias characteristic curve may be shifted by varying the intrinsic intermediate layer, also by varying the doping of the injection layers.

Figure 11:
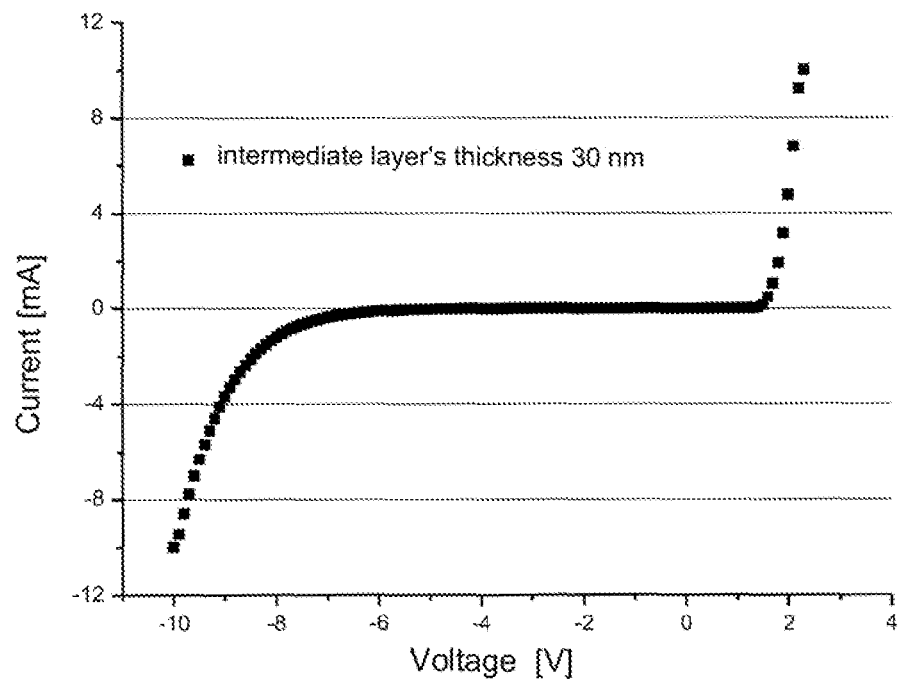
FIG. 11 is a current-voltage curve for organic zener diodes with structure according to FIG. 1 and having a 30 nm thick intrinsic intermediate layer of a single molecule for the ambipolar "low-gap" material pentacene.

FIG. 11 shows the current-voltage characteristic curve of a component according to the fourth embodiment having an intrinsic layer thickness of 30 nm. The characteristic curves for a 30 nm thick intrinsic pentacene layer from an intermediate layer are shown.

Example 6

In a sixth embodiment of an organic zener diode according to FIG. 1, the following structure is provided:
(21.4) Anode: Indium-tin oxide (ITO)
(22.4) Injection layer for holes: 50 nm Meo-TPD 4 wt % by weight doped with 2,2'-(Perfluoronaphthaline-2,6-diylidene)-dimalodinitrile
(23.4) Hybrid intermediate layer: 8 nm BAlq and/or 8 nm NPB
(24.4) Injection layer for electrons: 50 nm BPhen doped with caesium
(25.4) Cathode: 100 nm aluminium This embodiment relates to an organic zener diode that differs from the previous embodiments in that the intrinsic organic intermediate layer consists solely of a unipolar material. In this example too, the reverse bias characteristic curve may be shifted by varying the intrinsic intermediate layer, also by varying the doping of the injection layers.

Figure 12:
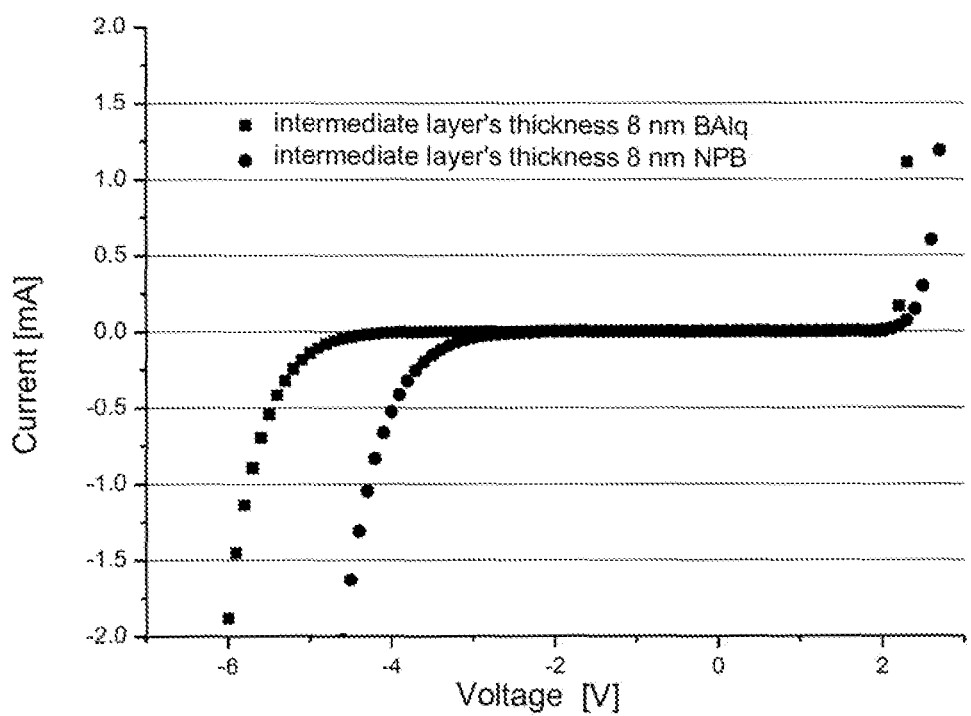
FIG. 12 is a current-voltage curve for organic zener diodes with structure according to FIG. 1 and having an 8 nm thick intrinsic intermediate layer of the unipolar materials Balq and NPB.

FIG. 12 shows the current-voltage characteristic curve of a component according to the sixth embodiment having an intrinsic layer thickness of 8 nm. The characteristic curves for an intermediate layer thickness of 8 nm for the electron-conducting material BAlq and the hole conducting material NPB are shown.

The optimisation approaches discussed with reference to the first embodiment also apply for all the other embodiments presented.

Charge carrier injection layer or only injection layer: Layer that helps to transfer majority charge carriers from layer disposed on one side to another layer disposed on the opposite side.

The energy barrier refers to a barrier to charge carrier injection from the charge injection layer into the intermediate layer when the component is being used in normal diode operation (forward bias).

An oligomer is a molecule that is constructed from a number of identical or similar units. Oligomers include dimers, trimers and larger molecules including up to 30 units. Molecules that are composed of more than 30 identical or similar units are called polymers.

Forward biasing and reverse biasing are the normal technical terms as applied to the use of conventional diodes. In FIG. 4, the diode is operated with forward biasing when it is operated with positive voltage. The diode is operated with reverse biasing when it is operated with negative voltage.

The current breakdown of a diode in reverse biasing is defined by the negative voltage range after which current essentially flows through the diode, which is represented in FIG. 4 by the range from about −2.5 V to more negative voltages. This is also referred to as zener behaviour.

It should also be noted that when the zener diode is being operated, the reverse bias current must be restricted if it is too high, to prevent it from destroying the diode. The same applies for normal diodes in the forward bias direction.

The technical terms used are explained in the following:

| | |
|---|---|
| ITO | Indium-tin oxide |
| HTM | Semiconductor material that transports holes, also called a p-type conductor, can be p-doped, |
| ETM | Semiconductor material that transports electrons, also called an n-type conductor, can be n-doped, |
| Bphen | 4,7-Diphenyl-1,10-phenanthroline, |
| BCP | 2,9-Dimethyl-4,7-diphenyl-1,10-phenanthroline (usually used as ETM), |
| Alq3 | Aluminium-tris(8-hydroxyquinoline) (usually used as ETM), |
| C60 | Fullerene C60 (used as ETM), |
| PTCBI | 3,4,9,10-Perylenetetracarboxylic acid bisbenzimidazole, |
| PTCDI | 3,4,9,10-Perylenetetracarboxylic acid diimide, |

-continued

| | |
|---|---|
| TCNQ | Tetracyanoquinodimethane, |
| F4-TCNQ | 2,3,5,6-Tetrafluoro-7,7,8,8-tetracyanoquinodimethane (strong organic acceptor, usually used for doping HTM), |
| PBD | 2-(4-Biphenylyl)-5-(p-tert-butylphenyl)-1,3,4-oxadiazole, |
| OXD | 1,3-Bis[(p-tert-butyl)phenyl-1,3,4-oxadiazoyl]benzene, |
| TAZ | 3-(Biphenyl-4-yl)-4-phenyl-5-(4-tert-butylphenyl)-1,2,4-triazole, |
| TPOB | 1,3,5-Tris(4-tert-butylphenyl-1,3,4-oxadiazolyl)-benzene, |
| TCTA | 4,4',4"-Tris(N-carbazol)-triphenylamine, |
| TPBI | 2',2"-(1,3,5-Phenylene)tris[1-phenyl-1H-benzimidazole], |
| NPB | N,N'-Bis(naphthaline-1-yl)-N,N'-bis(phenyl)-benzidine, |
| MeO-TPD | (N,N,N',N'-Tetrakis(4-methoxyphenyl)-benzidine), |
| RE68 | Tris(1-phenylisoquinoline)iridium(III), |
| Trap states | Deep states for electrons in the conduction band (LUMO), which capture the electrons. For holes, the trap states are high states in the valence band (HOMO) which capture the holes, |
| Donor | n-dopant, |
| Acceptor | p-dopant, |
| Matrix molecule | Matrix material, matrix molecule that forms a layer in which the dopant molecules are embedded. |
| HOMO | Highest Occupied Molecular Orbital |
| LUMO | Lowest Unoccupied Molecular Orbital |
| Precursor | A substance that is not converted into an active molecule until it is modified. |
| "High gap" material | Material with an optical band gap that is of such a size as to render the material essentially transparent. The gap is typically larger than 2 eV. |
| "Low gap" material | Material with an optical band gap that is of such a size as to render the material essentially opaque for layers of sufficient thickness. The band gap is typically smaller than or equal to 2 eV. |
| Homojunction | Junction, typically a pn junction, wherein both sides (p and n) are created essentially from the same transport material. |
| Zener diode | Diode having a relatively low reverse bias breakdown voltage and a steep characteristic curve in the forward bias direction. In the passing direction, they behave like normal diodes, but in the blocking direction above a certain voltage, the blocking or breakdown voltage, their resistance suddenly falls sharply. |
| Injection layer for holes | Layer in an electronic device that has holes as majority charge carriers under forward biased voltage and injects them into another layer. |
| Injection layer for electrons | Layer in an electronic device that has electrons as majority charge carriers under forward biased voltage and injects them into another layer. |
| Organic vapour phase deposition | Organic vapour phase deposition |

The features of the invention disclosed in the preceding description, the claims and the drawing may be significant either individually or in any combination for the realisation of the invention in its various embodiments.

The invention claimed is:

1. A zener diode comprising one electrode, one counter electrode, and an organic layer arrangement, wherein the organic layer arrangement is in electrical contact with the electrode and counter electrode, and wherein the organic layer arrangement comprises:
   an n-doped charge carrier injection layer, wherein the n-doped charge carrier injection layer comprises a mixture of a first organic matrix material and an n-dopant,
   a p-doped charge carrier injection layer, wherein the p-doped charge carrier injection layer comprises a mixture of a second organic matrix material and a p-dopant, wherein the p-doped charge carrier injection layer is arranged closer to the counter electrode than the n-doped charge carrier injection layer, wherein the first organic matrix material and the second organic matrix material are different matrix materials, and
   an electrically undoped organic intermediate layer, wherein the electrically undoped organic intermediate layer is arranged between the n-doped charge carrier injection layer and the p-doped charge carrier injection layer, and the electrically undoped organic intermediate layer is made of one or more organic materials, the one or more organic materials being different from the first organic matrix material and the second organic matrix material.

2. The zener diode as recited in claim 1, wherein the n-dopant or the p-dopant is a molecular dopant.

3. The zener diode as recited in claim 1, wherein the electrically undoped organic intermediate layer has unipolar charge carrier transport properties such that the mobility for charge carriers in the form of electrons and the mobility for charge carriers in the form of holes are different.

4. The zener diode as recited in claim 1, wherein the electrically undoped organic intermediate layer has ambipolar charge carrier transport properties such that the mobility for charge carriers in the form of electrons and the mobility for charge carriers in the form of holes are substantially the same.

5. The zener diode as recited in claim 4, wherein the electrically undoped organic intermediate layer consists of one organic material.

6. The zener diode as recited in claim 4, wherein the electrically undoped organic intermediate layer comprises a mixture of multiple organic materials.

7. The zener diode as recited in claim 1, wherein
   the electrically n-doped charge carrier injection layer comprises the first organic matrix material and the n-dopant in a ratio of at least 1 mol % dopant to matrix material, and the electrically p-doped charge carrier injection layer comprises the second organic matrix material and the p-dopant in a ratio of at least 1 mol % dopant to matrix material.

8. The zener diode as recited in claim 1, wherein the n-doped charge carrier injection layer and the p-doped charge carrier injection layer are electrically doped via metal ions.

9. The zener diode as recited in claim 1, wherein the electrically undoped organic intermediate layer has a layer thickness between about 1 Angstrom and about 100 nm.

10. The zener diode as recited in claim 9, wherein the electrically undoped organic intermediate layer has a layer thickness between about 1 nm and about 10 nm.

11. The zener diode as recited in claim 1, wherein at least one of the following layers contains at least one inorganic material: the electrically n-doped charge carrier injection layer, and the electrically p-doped charge carrier injection layer.

12. The zener diode as recited in claim 1, wherein at least one of the electrically n-doped charge carrier injection layer, the electrically p-doped charge carrier injection layer, and the electrically undoped organic intermediate layer comprises at least one organic material selected from the following group of organic materials: oligomer material and polymer material.

13. An electronic circuit arrangement comprising an organic zener diode and a storage element, wherein the organic zener diode comprises one electrode, one counter electrode, and an organic layer arrangement, wherein the organic layer arrangement is in electrical contact with the electrode and counter electrode, and wherein the organic layer arrangement comprises:
   an n-doped charge carrier injection layer, wherein the n-doped charge carrier injection layer comprises a mixture of a first organic matrix material and an n-dopant,
   a p-doped charge carrier injection layer, wherein the p-doped charge carrier injection layer comprises a mixture of a second organic matrix material and a p-dopant, wherein the p-doped charge carrier injection layer is arranged closer to the counter electrode than the n-doped charge carrier injection layer, wherein the first organic matrix material and the second organic matrix material are different matrix materials, and
   an electrically undoped organic intermediate layer, wherein the electrically undoped organic intermediate layer is arranged between the n-doped charge carrier injection layer and the p-doped charge carrier injection layer, and the electrically undoped organic intermediate layer is made of one or more organic materials, the one or more organic materials being different from the first organic matrix material and the second organic matrix material.

* * * * *